United States Patent
Kai et al.

(10) Patent No.: US 6,784,601 B2
(45) Date of Patent: Aug. 31, 2004

(54) DISCHARGE LAMP INCLUDING HEAT RELEASING DEVICE AND LAMP DEVICE

(75) Inventors: Makoto Kai, Katano (JP); Makoto Horiuchi, Sakurai (JP); Mamoru Takeda, Soraku-gun (JP); Tomoyuki Seki, Takatsuki (JP); Tsuyoshi Ichibakase, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 173 days.

(21) Appl. No.: 09/890,127

(22) PCT Filed: Nov. 30, 2000

(86) PCT No.: PCT/JP00/08494

§ 371 (c)(1),
(2), (4) Date: Jul. 27, 2001

(87) PCT Pub. No.: WO01/40861

PCT Pub. Date: Jun. 7, 2001

(65) Prior Publication Data

US 2002/0158579 A1 Oct. 31, 2002

(30) Foreign Application Priority Data

Dec. 2, 1999 (JP) .......................... 11-343929

(51) Int. Cl.⁷ .......................... H01J 61/52; H01K 1/58
(52) U.S. Cl. .......................... 313/46; 313/18; 313/19; 313/25; 313/47; 313/635; 362/263; 362/264; 362/265; 362/266; 362/267
(58) Field of Search .......................... 313/18, 19, 21, 313/25, 39, 42, 43, 44, 46, 47, 11, 113, 635; 362/263, 264–267, 261, 218, 294

(56) References Cited

U.S. PATENT DOCUMENTS 3,684,908 A * 8/1972 Beese .......................... 313/24
5,204,578 A * 4/1993 Dever et al. .................. 313/25
5,420,769 A * 5/1995 Ahlgren et al. ............. 362/294
5,957,570 A    9/1999 Ooyama et al. ............. 362/263
6,281,629 B1   8/2001 Tanaka et al. .............. 313/631
6,575,599 B1 * 6/2003 Imamura et al. ........... 362/294

FOREIGN PATENT DOCUMENTS

| JP | 63-244504 | 10/1988 |
| JP | 04-282553 | 10/1992 |
| JP | 05-135748 | 6/1993 |
| JP | 05-325902 | 12/1993 |
| JP | 08-102298 | 4/1996 |
| JP | 08-250071 | 9/1996 |
| JP | 10-125287 | 5/1998 |
| JP | 11-039934 | 2/1999 |
| JP | 11-317196 | 11/1999 |

* cited by examiner

Primary Examiner—Nimeshkumar D. Patel
Assistant Examiner—Sikha Roy
(74) Attorney, Agent, or Firm—Parkhurst & Wendel, L.L.P.

(57) ABSTRACT

The present invention relates to a lamp device using a high-pressure vapor discharge lamp, particularly to an improvement for controlling the influence of the generation of heat, which accompanies an increase in lamp power and a reduction in the size of a reflector. A lamp device of the present invention comprises a discharge lamp having an arc tube enclosing luminescent materials and having a pair of opposing electrodes disposed therein and a pair of sealed portions extending from the arc tube; a reflector which reflects light radiated by the discharge lamp; a transparent member covering an open end of the reflector and accommodating the discharge lamp in a space between the transparent member and the reflector; and means for preventing an excessive temperature rise wherein the temperature rise of welded parts of wiring members electrically connected to the electrodes of the discharge lamp is restricted.

2 Claims, 10 Drawing Sheets

| 10 | lamp device | 25 | discharge electrodes |
| 11 | reflector | 27, 28 | metal foils |
| 12 | glass plate | 29, 30 | metal rods |
| 22 | arc tube | 29a, 30a, 31a | welds |
| 23, 24 | sealed portions | 31 | lead wire |

| | |
|---|---|
| 10 lamp device | 25 discharge electrodes |
| 11 reflector | 27, 28 metal foils |
| 12 glass plate | 29, 30 metal rods |
| 22 arc tube | 29a, 30a, 31a welds |
| 23, 24 sealed portions | 31 lead wire |

Partial cross section taken along line A-A`

DISCHARGE LAMP INCLUDING HEAT RELEASING DEVICE AND LAMP DEVICE

TECHNICAL FIELD

The present invention relates to a discharge lamp having a pair of opposing discharge electrodes and enclosing mercury, rare gases, and so forth in an arc tube. It also relates to a lamp device constructed such that this kind of discharge lamp is built into the inside of a reflector. This lamp device can be used as, for example, the light source of a screen projector.

BACKGROUND ART

Conventionally, as, for example, the light source of a screen projector, a lamp device provided with a discharge lamp, such as a high-pressure mercury vapor discharge lamp, inside a concave reflector has been used. A discharge lamp is constructed such that a pair of opposing discharge electrodes is provided, and mercury, rare gases, and so forth are enclosed in an arc tube. In order that the interior of the arc tube be gastight, power is supplied to the discharge electrodes by means of wiring members enclosed in sealed portions, which are provided on both sides of the arc tube, and connected by welding or the like. In addition, by adjusting the discharge electrodes so as to be at a comparatively short distance from each other and forming an arc having a short arc length (short arc), projected light is efficiently supplied to a specified optical system, and thus a bright image can be projected on a screen.

A discharge lamp such as the one described above is characterized in that the arc tube reaches a very high temperature during operation. Specifically, in, for example, a 100 W to 150 W common short arc high-pressure mercury vapor discharge lamp, the maximum temperature of the arc tube (the interior wall surface side of the upper portion of the arc tube) is approximately 900° C. to 1000° C. In addition, the temperature of the sealed portions is about 500° C., lower than the above-mentioned maximum temperature, but still a rather high temperature. For this reason, the wiring members disposed in the sealed portions are composed of a high melting point metal such as molybdenum. However, when the temperature of these sealed portions rises too much, the welded portions of the wiring members in the sealed portions and near the sealed portions begin to oxidize, corrode, and the like resulting in disconnection, and there is a risk of the lamp being extinguished. Thus, in a common projector, a cooling fan is provided in the main body of the projector making it possible to prevent an excessive temperature rise of the discharge lamp and the reflector. It is to be noted that, in order to prevent disconnection by oxidation and the like of the welded portions of the wiring members as described above, it is thought that the temperature of the above-mentioned welded portions should be regulated according to, for example, the standard (350° C.) specified in the regulations for halogen lamps, "Tungsten Halogen Lamps," IEC (International Electrochemical Commission) 60357 and "Halogen Lamps," JIS (Japanese Industrial Standards) C7527, and it is preferable to restrict the temperature to, at the highest, 400° C. or less.

In addition, the discharge lamp is characterized in that the inside of the arc tube reaches a very high pressure during operation. Specifically, in, for example, a 100 W to 150 W common discharge lamp as above, the pressure (operating pressure) of the inside of the arc tube approaches 200 atmospheres. For this reason, when the arc tube is damaged during lamp operation, large explosive sounds and the scattering of glass fragments tend to result. The occurrence of these kinds of large explosive sounds and scattering of glass fragments, for example, especially when the discharge lamp is applied to projectors for household use, is a factor in lowering the commercial value of the lamp. Thus, lamp devices which block the open end of the reflector with a glass plate to lower the frequency of explosive sounds and the scattering of glass fragments are widely used. When a completely hermetically sealed space is formed between the reflector and the glass plate by the reflector and the glass plate, the temperature rise of the discharge lamp is considerable. On the other hand, when a notch or the like is provided in the reflector and/or the glass plate and outside air is circulated inside the lamp in order to cool the discharge lamp, in event that the arc tube is damaged, substantial reduction in explosive sounds and consistent prevention of the scattering of glass fragments and dispersal of mercury vapor are difficult to achieve.

Furthermore, in recent years, there have been increasing demands for an increase in the brightness of projected images and a reduction in the size of projectors. However, because increase in lamp power and reduction in the size of the reflector, which accompany these demands, invite an even greater temperature rise in discharge lamps, it has been difficult to satisfy the demands. Therefore, in order to sufficiently satisfy the increasing demands for an increase in the brightness of projected images and a reduction in the size of projectors, effective restriction of the temperature rise of a lamp device accompanying an increase in output and reduction in the size of a reflector and above all restriction of a temperature rise at the welded portions of wiring members are needed.

DISCLOSURE OF THE INVENTION

In view of the foregoing problems, it is an object of the present invention to provide a high-pressure vapor discharge lamp and a lamp device which, even with an increase in lamp power and a reduction in the size of the reflector, can prevent disconnection due to oxidation and the like of the welded portions of wiring members and the like and with which a lengthening of lamp life and a decline in the percentage of defective lamps can be expected. It is another object of the present invention to provide a lamp device that can reduce explosive sounds from the arc tube and consistently prevent the scattering of glass fragments and the dispersal of mercury vapor.

The foregoing problems are solved in one aspect of the invention, by the provision of a lamp device comprising:

a discharge lamp comprising an arc tube, the arc tube enclosing luminescent materials and having disposed therein a pair of opposing electrodes, and a pair of sealed portions extending from the arc tube (namely, the sealed portions are coupled to the arc tube);

a reflector which reflects light radiated by the discharge lamp;

a transparent member covering an open end of the reflector and accommodating the discharge lamp in a space between the transparent member and the reflector; and means for preventing an excessive temperature rise wherein the temperature rise of welded parts of wiring members electrically connected to the electrodes is restricted.

In other words, according to the present invention, in a lamp device accommodating a discharge lamp in a space formed by a reflector and a transparent member covering the reflector, a means for preventing an excessive temperature rise of the wiring members and welded parts of the wiring members caused by the generation of heat accompanying operation of the lamp is provided. Through this means, it is possible to limit thermal degradation of the welded parts of wiring members. Thus, disconnection at the welded parts is prevented, and a lengthening of lamp life and a decline in the percentage of defective lamps can be anticipated. In addition, demands for increased lamp power and reduction in the size of reflectors can be responded to without difficulty.

The discharge lamp may have a foil sealed construction.

The present invention is useful in so-called foil sealed construction discharge lamps, which are widely used. In foil sealed construction discharge lamps, metal foils, serving as the wiring members in the sealed portions and capable of securing a large area of contact, are used such that adhesion is maintained despite the difference in the coefficients of thermal expansion of the glass and the metal foils, and the hermetic seal of the space in which the electrodes and so forth are disposed is maintained despite damage from thermal shock between the glass that forms the sealed portions and the metal foils. One end of a metal foil, located in the end portion of a sealed portion, is connected by welding to a conducting member that is connected to an external power source. By providing a means for preventing an excessive temperature rise, it is possible to prevent an excessive temperature rise at the welded parts of the metal foils and the wiring members within the sealed portions, which reach high temperatures. In addition, the temperature rise at the welded parts of wiring members which are outside the sealed portions but located near the sealed portions can be restricted.

Of course, even in lamp devices that use discharge lamps not having a foil sealed construction, for example, a discharge lamp having rod-shaped wiring members sealed in the sealed portions or a discharge lamp in which the electrodes pass through the sealed portions, disconnection at the welded parts of the rod-shaped wiring members or the electrodes and other wiring members can be prevented.

An inside space of the reflector and the transparent member may be hermetically sealed in a gastight manner. Thus, in event that the arc tube is damaged, explosive sounds can be greatly reduced and prevention of the scattering of glass fragments and the dispersal of mercury vapor can be ensured.

The pair of sealed portions may have differing lengths and the means for preventing an excessive temperature rise may be such that the longer sealed portion is on the side of the transparent member and the shorter sealed portion is on the side of the base of the reflector.

More specifically, it is preferable that an end of the sealed portion on the side of the transparent member be positioned near the transparent member.

In a lamp device, because the sealed portion on the side of the transparent member reaches a higher temperature than the sealed portion on the side of the base of the reflector, the welded parts of the wiring members in the sealed portion on the side of the transparent member are more subject to degradation by heat than are the welded parts of wiring members in the other sealed portion. In addition, in a discharge lamp having a foil sealed construction, the welded part of the metal foil and the conductive member on the side connected with an external power source is more subject to degradation by heat than is the welded part of the metal foil and the discharge electrode, which reaches a higher temperature, due to the weakness of the gastight seal. Thus, as described above, by adjusting the length of the sealed portions, because the distance from the front end of the sealed portion on the side of the transparent member to the light-emitting portion is longer than that of the other sealed portion, the temperature of the front end of the sealed portion on the side of the transparent member can be restricted to a low temperature, and disconnection by oxidation and the like of the welds of wiring members and the like in the front end of the sealed portion on the side of the transparent member or near this front end can be prevented.

The means for preventing an excessive temperature rise may be means for channeling heat such that heat from the sealed portion disposed on the side of the transparent member is conducted to the exterior of the lamp device.

For the means for channeling heat, it is possible to use, for example, a copper plate or a heat pipe having one end wrapped around the sealed portion and the other end extended to the exterior of the lamp device. By means of a heat channeling means such as this, because the heat of the sealed portion is released outside the lamp device, it is indeed possible to restrict the temperature of the front end of the sealed portion to a low temperature and to prevent disconnection by oxidation and the like of the welds of wiring members and the like.

The means for preventing an excessive temperature rise may be such that the sealed portion disposed on the side of the transparent member is integral with the transparent member Thus, because heat from the front end of the sealed portion is released from the exterior surface of the transparent, hermetically sealed member and the like, the temperature of the front end of the sealed portion can indeed be restricted to a low temperature, and disconnection due to oxidation and the like of the welds of wiring members and the like can be prevented.

The means for preventing an excessive temperature rise may be such that the front end of the sealed portion disposed on the side of the transparent member projects into the exterior of the transparent member.

Thus, because the front end of the sealed portion is cooled by air from the outside, the temperature of the front end of the sealed portion can be restricted to a low temperature, and disconnection, due to oxidation and the like of the welds of wiring members and the like can be prevented.

A lamp device may further comprise cooling means for removing conducted heat to the exterior of the lamp device or for absorbing conducted heat.

For the cooling means, it is possible to use, for example, a cooling fan, heat releasing fins, a cooling module utilizing a Peltier element, or the like. Thus, because heat conducted by a heat channeling means, heat conducted to the surface or periphery of the transparent, hermetically sealed member, and heat from the front end of the protruding sealed portion can be efficiently released, it is possible to restrict the temperature of the front end of the sealed portion to a low temperature without difficulty.

A high-pressure vapor discharge lamp may comprise:
  an arc tube enclosing luminescent materials and having disposed therein a pair of opposing electrodes; and
  a pair of sealed portions extending from the arc tube, the pair of sealed portions having differing lengths.

By using a high-pressure vapor discharge lamp such as this one, it is possible to construct a lamp device which restricts the temperature of the front end of a sealed portion to a low temperature and thus can prevent disconnection due to oxidation and the like of welds of wiring members and the like.

Figure 1:
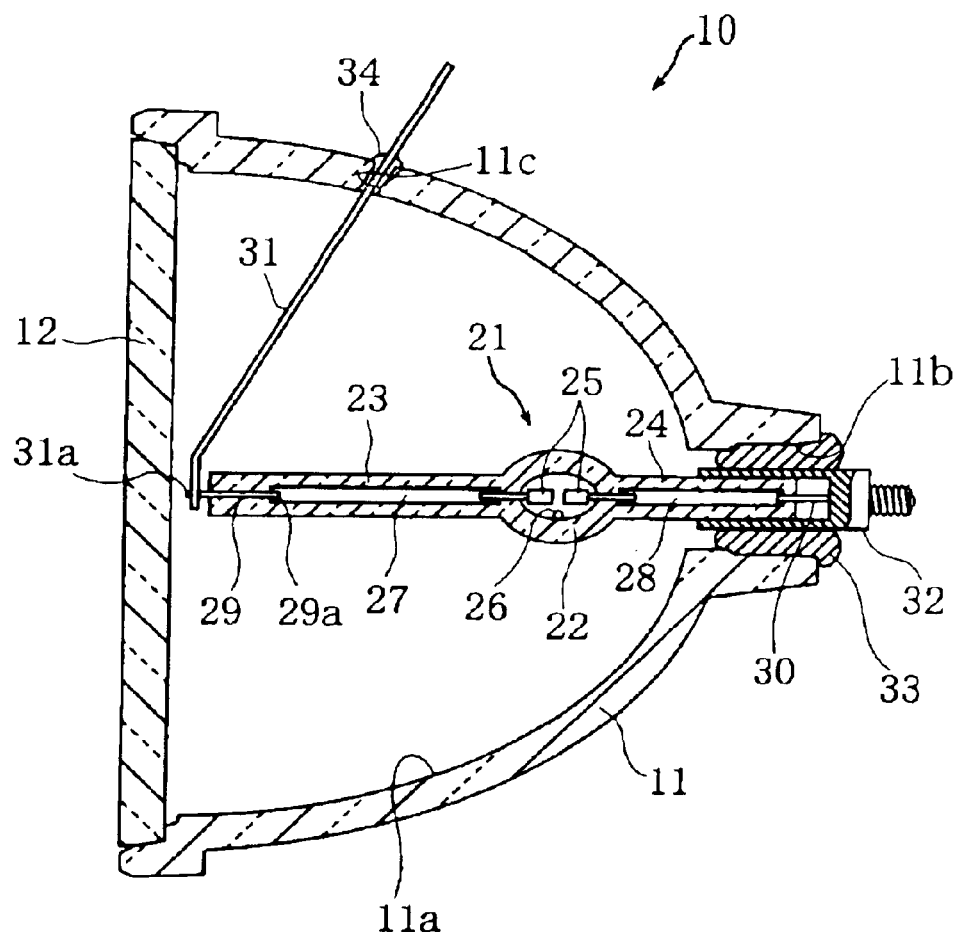
FIG. 1 is a longitudinal sectional view of a lamp device of Example 1.

REFERENCE NUMBERS 10 lamp device
11 reflector
11a reflector surface
11b lamp securing hole
11c lead wire hole
12 glass plate
12a hole
12 glass plate
22 arc tube
23 sealed portion
24 sealed portion
25 discharge electrodes
26 mercury
27, 28 metal foils
29, 30 metal rods
29a, 30a welds
31 lead wire
31a welds
32 cap
33, 34, 42 cement
41 heat releasing device
41a heat absorbing part
41b heat channeling part
41c heat releasing part
43 cooling device
51 cooling fan
52 filler

BEST MODE FOR CARRYING OUT THE INVENTION

In the following, as the preferred examples of the present invention, examples of lamp devices utilizing high-pressure mercury vapor discharge lamps are explained in detail with reference to the figures.

EXAMPLE 1

A high-pressure mercury vapor discharge lamp in which sealed portions are formed so that the lengths of the sealed portions are asymmetric and a lamp device utilizing the above-mentioned discharge lamp are explained.

A lamp device 10, as shown in FIG. 1, has, for example, an ellipsoidal reflector surface 11a and a reflector 11 with an open end having a diameter of 80 mm. In the inside of the reflector 11, for example, a discharge lamp 21 having a lamp power (rated power) of 200 W is disposed. The open end of the reflector 11 is hermetically sealed by a glass plate 12 such that, even when the discharge lamp 21 is damaged, prevention of large explosive sounds, the scattering of glass fragments, the dispersal of mercury vapor, and so forth is ensured.

The discharge lamp 21 has a pair of sealed portions 23 and 24 coupled to both ends of an arc tube 22 respectively. The sealed portions 23 and 24 are of different lengths, and the sealed portion 23 on the side of glass plate 12 is longer than the other sealed portion, the sealed portion 24. In addition, the sealed portion 23 is adjusted so that the front end of the sealed portion 23 is positioned near the glass plate 12. In the inside of the arc tube 22, a pair of coiled or rod-shaped discharge electrodes 25 comprising tungsten, for example, is provided and luminescent materials such as mercury 26, rare gases, and so forth (not shown in the figure) are enclosed. It is to be noted that the discharge lamp 21 is not limited to a high-pressure mercury vapor discharge lamp such as the one described above; a lamp such as one that further encloses a halogen gas, a metal halide, or the like for the fill material or one that does not contain mercury are also possibilities.

Figure 2:
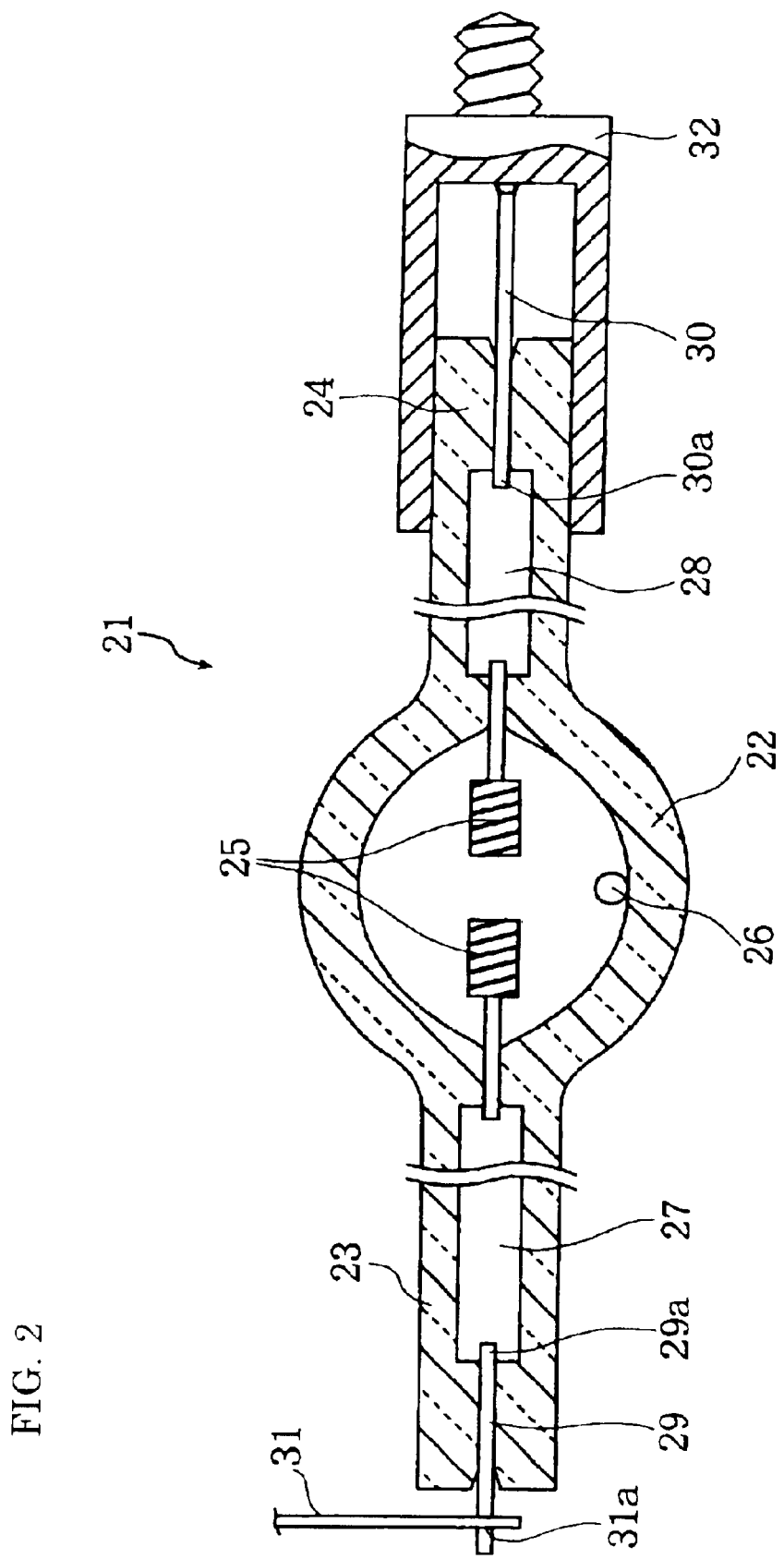
FIG. 2 is a longitudinal sectional view of a discharge lamp used in the above-mentioned lamp device.

The sealed portions 23 and 24 comprise metal foils 27 and 28, comprising a high melting point metal such as molybdenum, electrically connected to the electrodes 25 respectively and glass tubes extending from the arc tube 22. By the foil sealing of the metal foils 27 and 28 and the glass tubes, a gastight discharge space in the arc tube 22 is maintained. The pair of discharge electrodes 25 are welded to one of the ends of the metal foils 27 and 28, comprising molybdenum, for example, respectively, which were sealed in the sealed portions 23 and 24. The other ends of the metal foils 27 and 28 are welded, as shown in FIG. 2, to metal rods 29 and 30, comprising molybdenum and having ends exposed outside of the sealed portions 23 and 24, by welds 29a and 30a. The metal rod 29 is welded to a lead wire 31 by a weld 31a. The metal rod 30 is welded to a cap 32 covering an end of the sealed portion 24. The discharge electrodes 25 and the metal rods 29 and 30 are connected by means of the metal foils 27 and 28 sealed in the sealed portions 23 and 24 as described above, so that the hermetic seal of the interior of the arc tube 22 is strengthened, and high pressure is maintained. That is, because of the difference in the coefficient of thermal expansion and the like of the metal rods 29 and 30 and the glass, it is not necessarily easy to improve adhesion between the metal rods and the sealed portions 23 and 24. By contrast, because the metal foils 27 and 28 are very thin and the area of contact with the sealed portions 23 and 24 is very large, it is possible to easily improve adhesion between the metal foils and the sealed portions, and therefore, the interior of the arc tube 22 can be easily maintained at a high pressure.

The discharge lamp 21 is disposed such that the gap between the pair of discharge electrodes 25 (discharge arc) is positioned at the first focal point of the ellipsoid of the reflector 11, and at the cap 32 section, the lamp is sealed and secured into a lamp securing hole 11b, formed at the base of the reflector 11, with a cement 33. In addition, a lead wire 31 of the discharge lamp 21 passes through to the exterior of the reflector 11 through a lead wire hole 11c formed on the wall surface of the reflector 11. The above-mentioned lead wire hole 11c is also sealed with a cement 34.

By forming the sealed portions such that the sealed portion 23 on the side of the glass plate 12 is longer than the sealed portion 24 on the side of the cap 32 as was described above, because the distance between the weld 29a of the metal foil 27 and the metal rod 29 and the light-emitting portion of the discharge lamp 21 is lengthened, it is possible to restrict the temperature rise of the above-mentioned weld 29a. In the actual measurement of temperatures, a discharge lamp 21 having a sealed portion 23 and a sealed portion 24 both with lengths of 25 mm was operated at a lamp power of 200 W, and when the maximum temperature of the arc tube 22 (the interior wall surface side of the upper portion of the arc tube) approached 1000° C., the temperature of the weld 29a rose to 507° C. In contrast, with a discharge lamp 21 in which the length of the sealed portion 23 was made to be 35 mm and the length of the sealed portion 24 was made to be 25 mm, the temperature of the weld 29a was, at the highest, 388° C. This temperature is higher than the regulation temperature (350° C.) for halogen lamps as specified in IEC 60357, but it is a sufficiently low temperature for the prevention of oxidization, corrosion, and the like of the metal foil 27, the metal rod 29, and the weld 29a of the foil and rod. For this reason, even if adhesion between the metal rod 29 and the sealed portion 23 diminishes and the above-mentioned weld 29a and the like contact air in the lamp device 10, it is possible to prevent disconnection due to oxidation, corrosion, and the like. At the same time, it is possible to restrict the temperature rise of the welded part 31a of the metal rod 29 and the lead wire 31 and also to prevent disconnection at the welded part 31a. Accordingly, not only a lamp device utilizing a discharge lamp having a foil sealed construction as shown in FIG. 1, but also lamps utilizing discharge lamps which have a single rod wiring member in place of the metal foil 27 and the metal rod 29 or lamps that pass one of the electrodes 25 directly through the sealed portion 23 without using a metal foil 27 and expose the end of the electrode 25 to the outside of the sealed portion 23 can prevent disconnection at the welded part of the single rod wiring member or the electrode 25 and the lead wire 31.

When an ellipsoid mirror is used for the reflector 11 and a light-emitting portion is provided near the first focal point as described above, it is conceivable that because light reflected off of the reflector 11 converges at the second focal point, the closer the front end of the sealed portion 23 comes to the second focal point, the greater the heating action of the reflected light. However, normally, because the action of temperature decrease by distancing the front end of sealed portion 23 from the light-emitting portion is greater than the heating action, it is possible to restrict the temperature of the front end of the sealed portion 23 to a low temperature as described above. It is to be noted that it is also possible to restrict the temperature of the front end of the sealed portion 23 to a lower temperature by forming a reflecting layer along the whole length of the sealed portion 23 or on a periphery of the sealed portion 23, such as the periphery near the front end of the sealed portion 23 or the weld 29a, thus reducing the heating action of the above-mentioned reflected light. In addition, in cases in which the restriction of the temperature of the front end of the sealed portion 23 to a low temperature is obtained only by reducing the heating action of the reflected light, such as when the lamp power of the discharge lamp 21 is low, it is not always necessary to make the sealed portion 23 longer than the sealed portion 24.

EXAMPLE 2

An example of a lamp device provided with a means for releasing heat near a sealed portion of a discharge lamp to the exterior of the reflector is explained. It is to be noted that in the following aspect of the invention, the same reference numbers are used for elements of the construction having the same functions as those of the lamp device of Example 1, and explanation is omitted.

Figure 3:
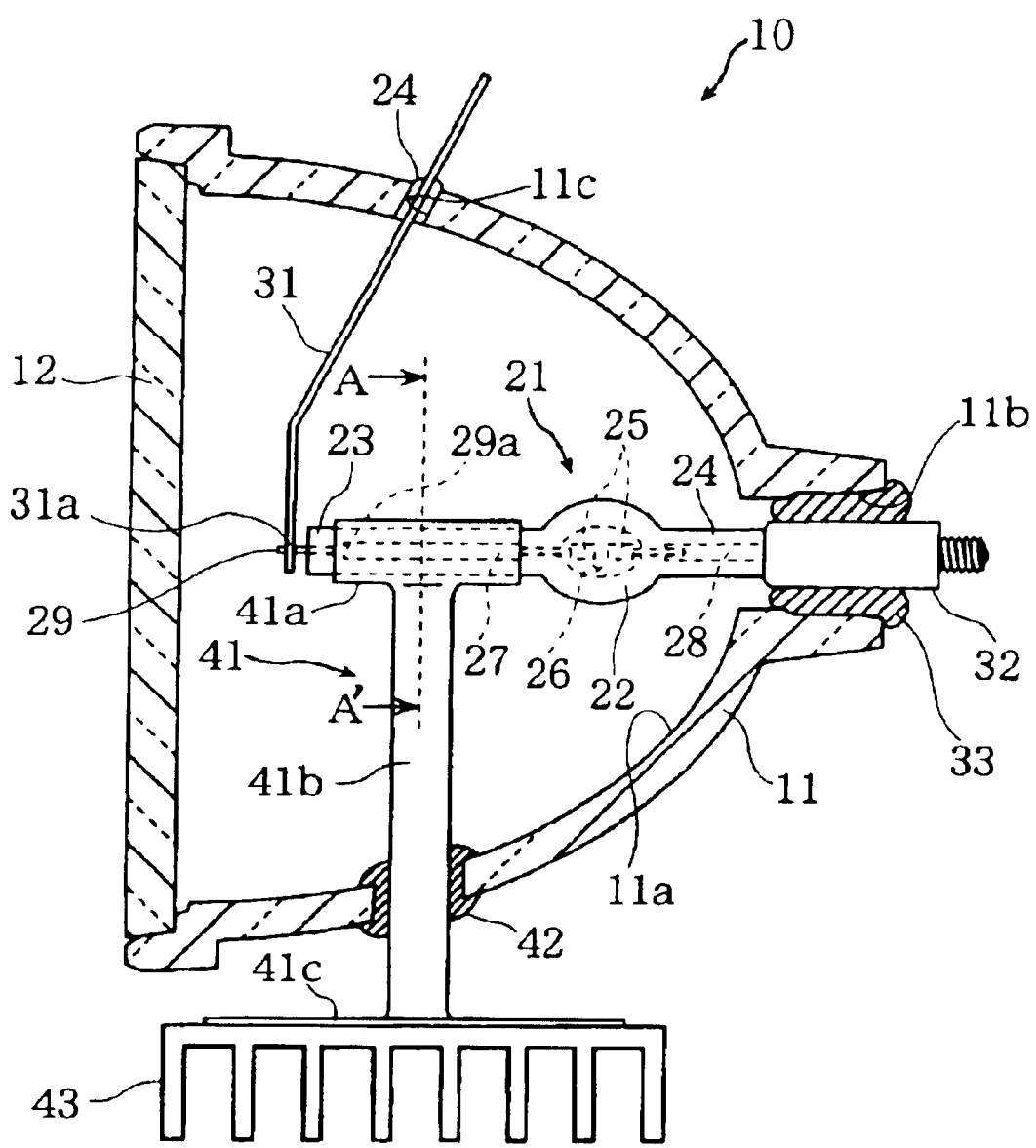
FIG. 3 is a longitudinal sectional view of a lamp device of Example 2.
Figure 4:
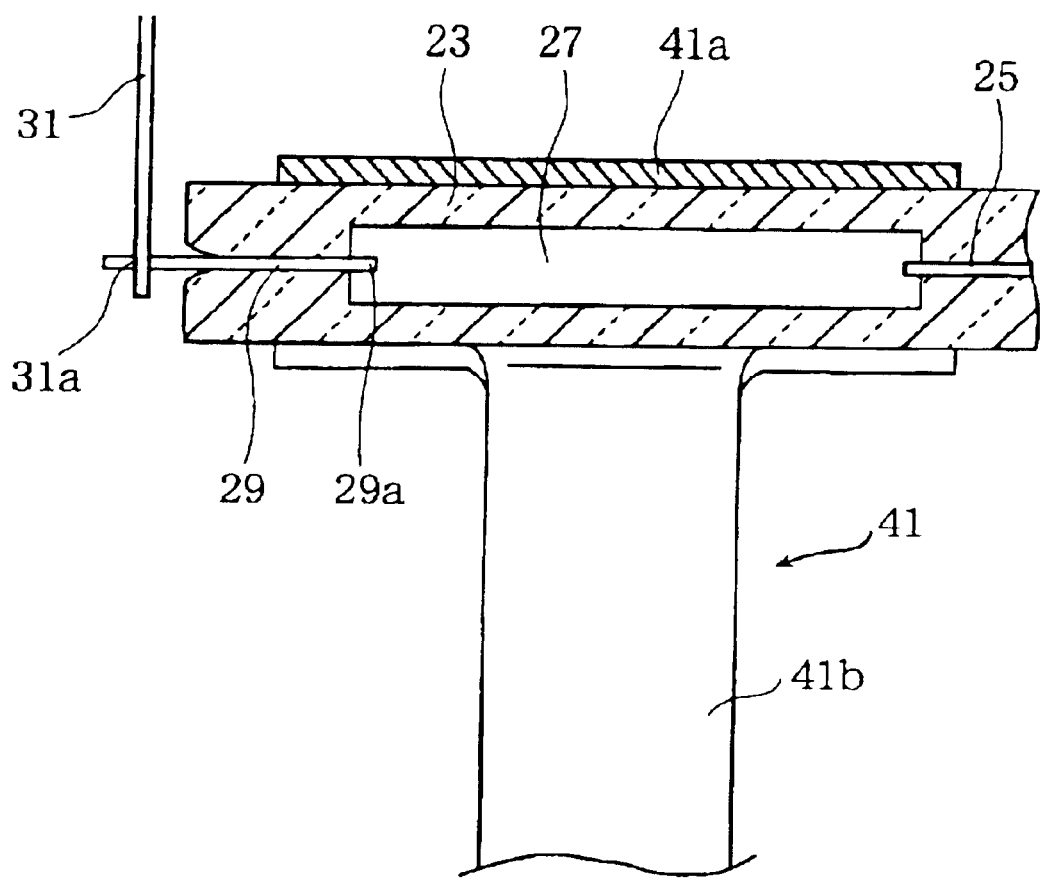
FIG. 4 is a longitudinal sectional view of an essential part of the above-mentioned lamp device.
Figure 5:
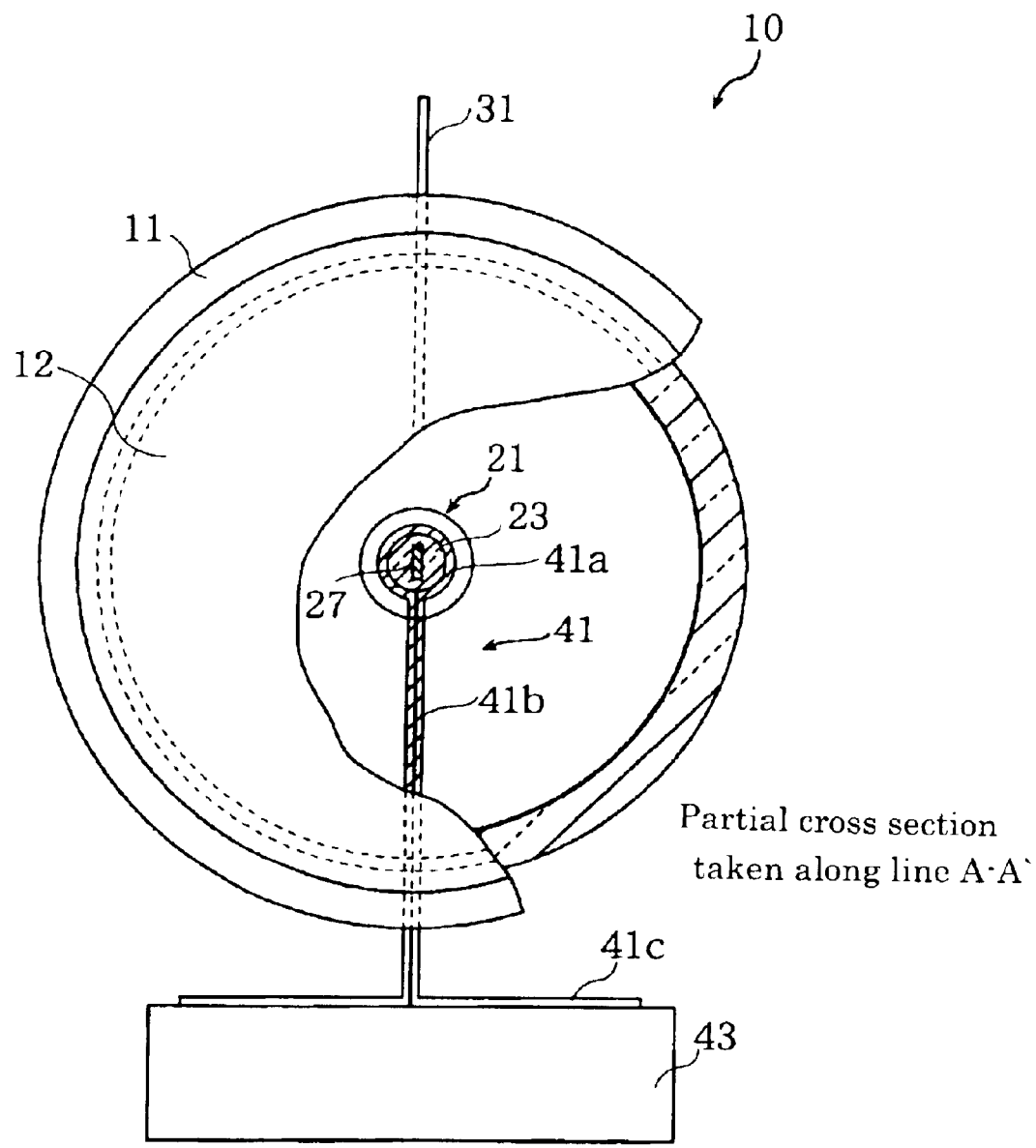
FIG. 5 is a front view of the above-mentioned lamp device having a cut out section.

In this lamp device 10, as shown in FIGS. 3 to 5, a heat releasing device 41, which releases heat near a sealed portion 23 of a discharge lamp 21 to the exterior of a reflector 11, is provided. This heat releasing device 41 comprises a material having a high thermal conductivity, such as copper plate, and is composed of a heat absorbing part 41a, which is wrapped around almost the whole length of the sealed portion 23, a heat channeling part 41b, which channels heat from the heat absorbing part 41a to the exterior of the reflector 11, and a heat releasing part 41c, which releases the channeled heat.

With the heat absorbing part 41a constructed such that a copper plate or the like is only wrapped around the periphery of the sealed portion 23, the specified advantageous effects can be obtained, but in order to obtain greater advantageous effects, the heat absorbing part 41a and the sealed portion 23 are adhered together. After interposing, for example, glass powder, having a lower melting point than the sealed portion 23, and wrapping the copper plate, the structure is heated and adhered. In addition, although the larger the adhered area (adhered length) of the heat absorbing part 41a with the sealed portion 23, the greater the advantageous effects of heat absorption, it is possible, not only to have a structure in which the heat absorbing part 41a is wrapped around the whole length of the sealed portion 23, but to have a structure in which the heat absorbing part 41a is wrapped around sections of the sealed portion 23 insofar as the temperature rise near the weld 29a can be restricted.

The heat channeling part 41b is set up with the surface of the copper plate perpendicular to the glass plate 12 such that the projected area in the direction of the optical axis, that is to say, the portion of projected light that becomes a shadow, is smaller. In addition, the portion of the heat channeling part 41b at the reflector 11 issuing to the outside is sealed with a cement 42 as, for example, shown in FIG. 3. FIG. 3 shows an example in which the width of the heat channeling part 41b was made narrower than the width of the heat absorbing part 41a, but it is also possible that the width be made the same as that of the heat absorbing part 41a and so forth.

In a heat releasing part 41c, a cooling device 43, such as heat releasing fins, is provided. It is to be noted that as the cooling device 43, in place of heat releasing fins, it is also possible to use a cooling fan, a cooling module utilizing a Peltier element, a water cooling device, or the like. It addition, it is possible to use a steel case having a high thermal conductivity for the cooling device 43. Furthermore, for the cooling device 43, these devices can be used in combination. Moreover, it is possible to circulate air in the space enclosed by the reflector 11 and the glass plate 12 between a radiator, disposed outside of the reflector, so that the inside of the lamp device is cooled.

According to the above-described construction, heat transmitted to the sealed portion 23 by thermal conduction and the like from the light-emitting portion of the discharge lamp 21 is conducted to the heat releasing part 41c, outside of the reflector 11, by means of conduction from the heat absorbing part 41a to the heat channeling part 41b, and is released. For this reason, it is possible to maintain a low temperature at the sealed portion 23 and to prevent disconnection by oxidation, corrosion, and the like of the weld 29a of the metal rod 29 and the metal foil 27. In addition, when the heat absorbing part 41a is provided, at least near the front end of the sealed portion 23, it is all the more possible to improve the advantageous effects of prevention of disconnection by oxidation, corrosion, and the like of the weld 31a of the metal rod 29 and the lead wire 31.

It is to be noted that the material used for the heat releasing device 41 is not limited to copper plate which was used above; as long as the material has a comparatively high thermal conductivity, the same cooling effects can be obtained.

In addition, in the heat channeling part 41b and the like, a heat pipe, a thin pipe which forces the circulation of a coolant, or the like may be used. In this case, the above-mentioned heat pipe or thin pipe may be affixed to the lead wire 31 and issued to the exterior of the reflector 11, and particularly, by coaxially aligning the heat pipe or thin tube with the lead wire 31, the amount of projected light blocked by the heat pipe or thin tube and the lead wire 31 can be easily limited to a small amount.

Figure 6:
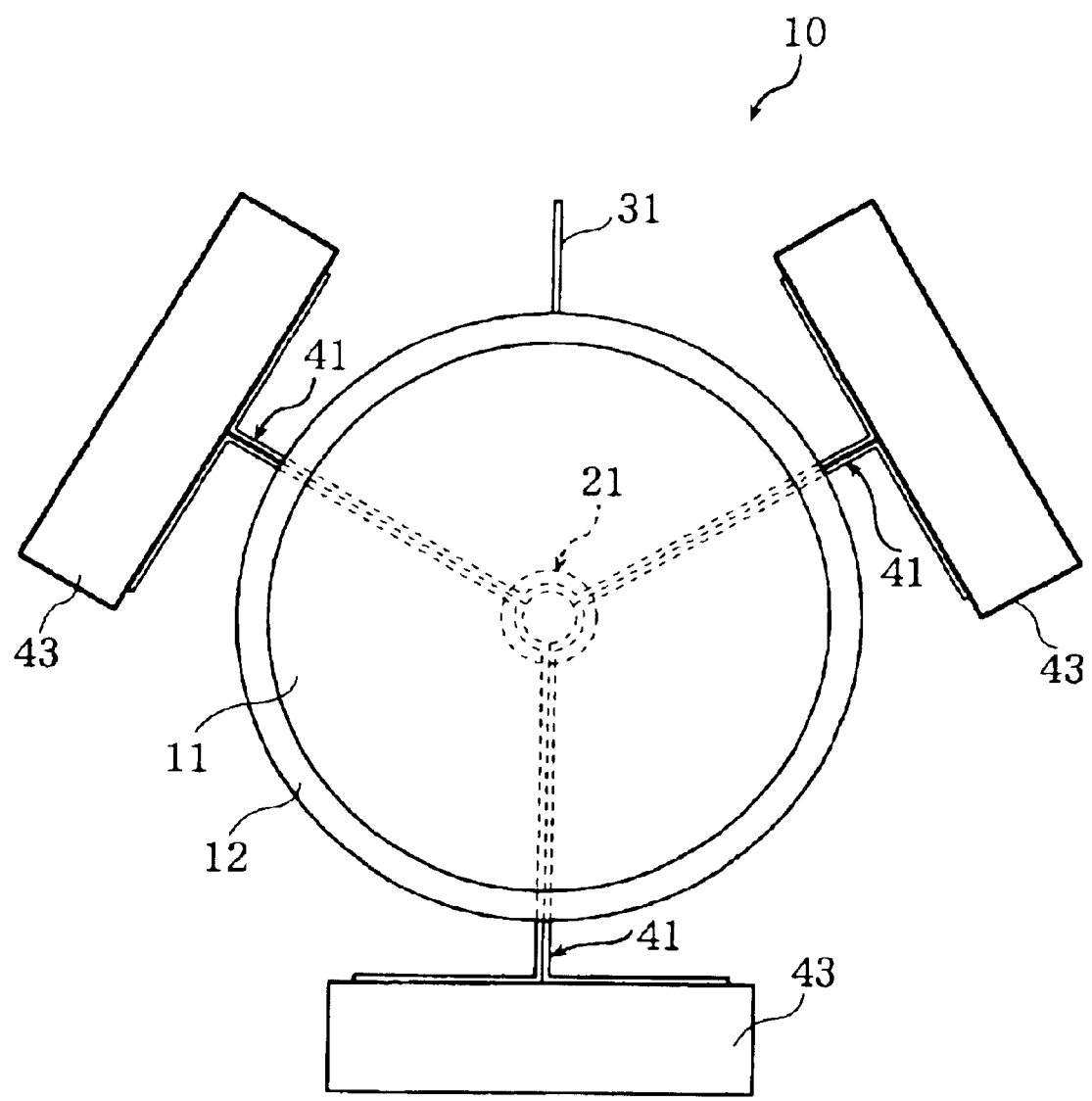
FIG. 6 is a front view of another lamp device of Example 2.

Furthermore, the heat channeling part 41b may be provided, not only in one location, but, as for example shown in FIG. 6, in a plurality of locations such that the amount of heat released is even greater.

Moreover, in FIG. 3 an example is shown in which the lengths of the sealed portion 23 and the sealed portion 24 are made to be equal, but this is not the only possibility; the length of the sealed portion 23 may be made longer as was the case in Example 1, or when the heat releasing effects are sufficiently obtained by the heat releasing device 41, the length of the sealed portion 23 may be made shorter.

EXAMPLE 3

An example of a lamp device constructed such that a discharge lamp is integrally formed with a glass plate and the front end of a sealed portion contacts outside air.

Figure 7:
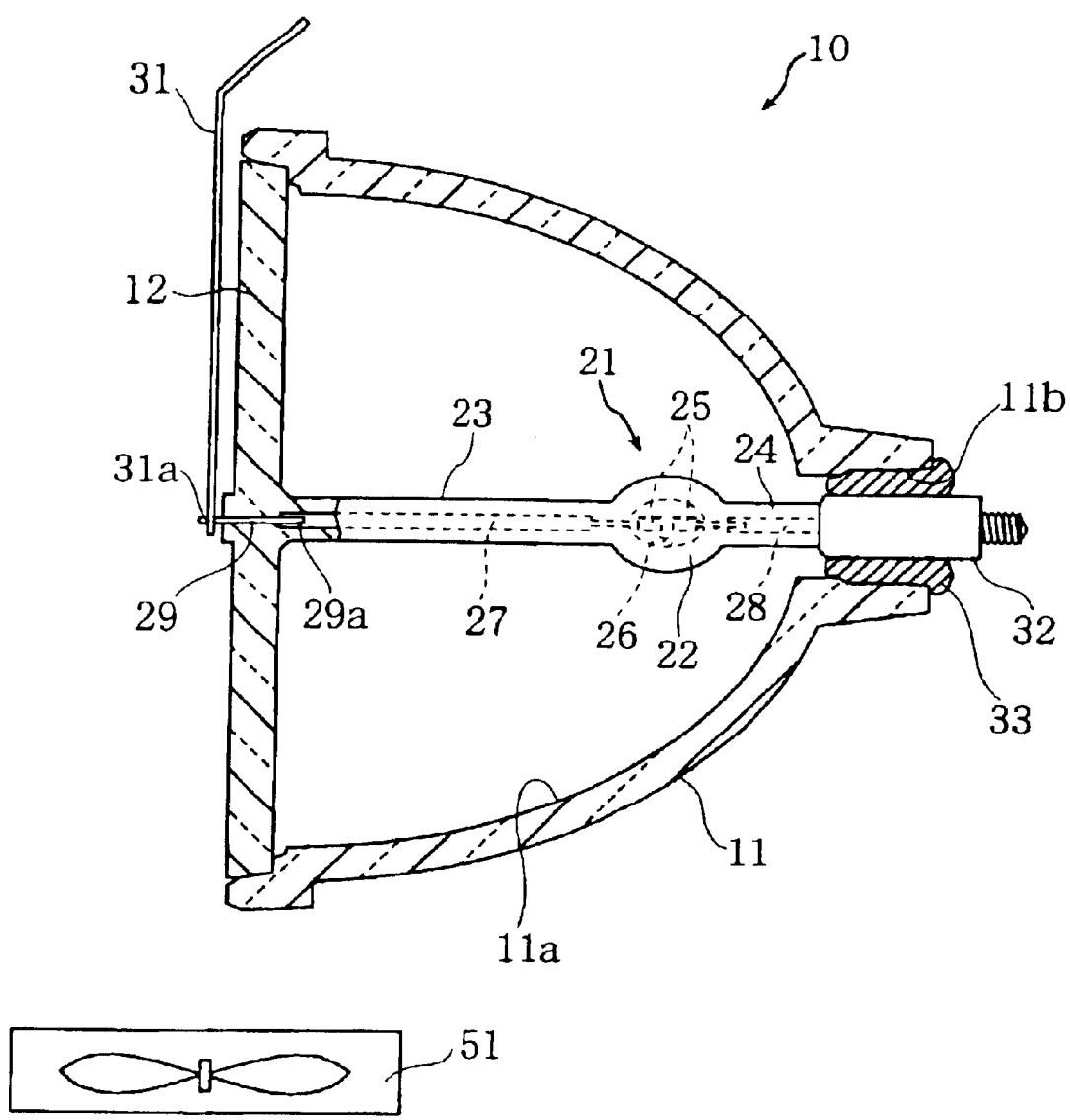
FIG. 7 is a longitudinal sectional view of a lamp device of Example 3.

As shown in FIG. 7, in a discharge lamp 21, the front end of a sealed portion 23 is integrally formed with a glass plate 12 and a weld 31a of the front end of a metal rod 29 and a lead wire 31 is exposed to the side of the exterior surface of the glass plate 12. In addition, near the glass plate 12, a cooling fan 51, blowing outside air on the exterior surface of the glass plate 12, is provided.

By constructing a lamp device as described above, because heat from the front end of the sealed portion 23 is released from the exterior surface of the glass plate 12 and the like, the temperature near a weld 29a of a metal foil 27 and the metal rod 29 is restricted to a low temperature, and disconnection, due to oxidation, corrosion, and the like of the weld 29a and so forth, is prevented.

It is to be noted that, in place of the cooling fan 51, heat releasing fins, a cooling module utilizing a Peltier element, or the like may be provided near the periphery of the glass plate 12 such that projected light is not blocked, or these devices may be combined and so forth. Furthermore, when, by natural convection near the exterior surface of the glass plate 12 and the like, the temperature near the weld 29a is sufficiently restricted to a low temperature, it is not necessary to provide the cooling fan 51 or the like.

Figure 8:
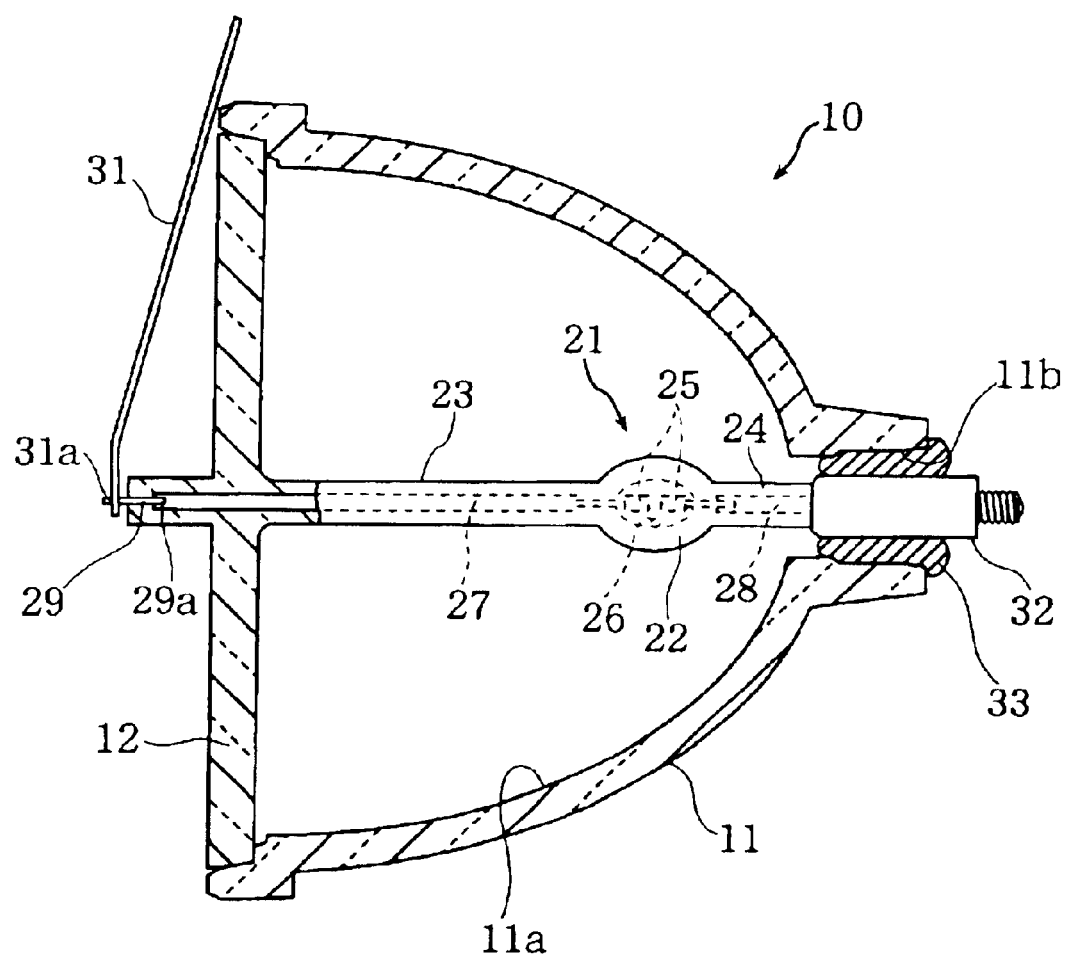
FIG. 8 is a longitudinal sectional view of another lamp device of Example 3.

In addition, in the example of FIG. 7, the front end of the sealed portion 23 only protrudes slightly from the surface of the glass plate 12, but when it is possible that the whole length (length in the direction of the optical axis) of a lamp device 10 be long, as shown in FIG. 8, the front end of the sealed portion 23 may further protrude from the surface of the glass plate 12. In this way, by positioning the weld 29a almost beyond the surface of the glass plate 12, the temperature near the weld 29a can be easily restricted to an even lower temperature.

Figure 9:
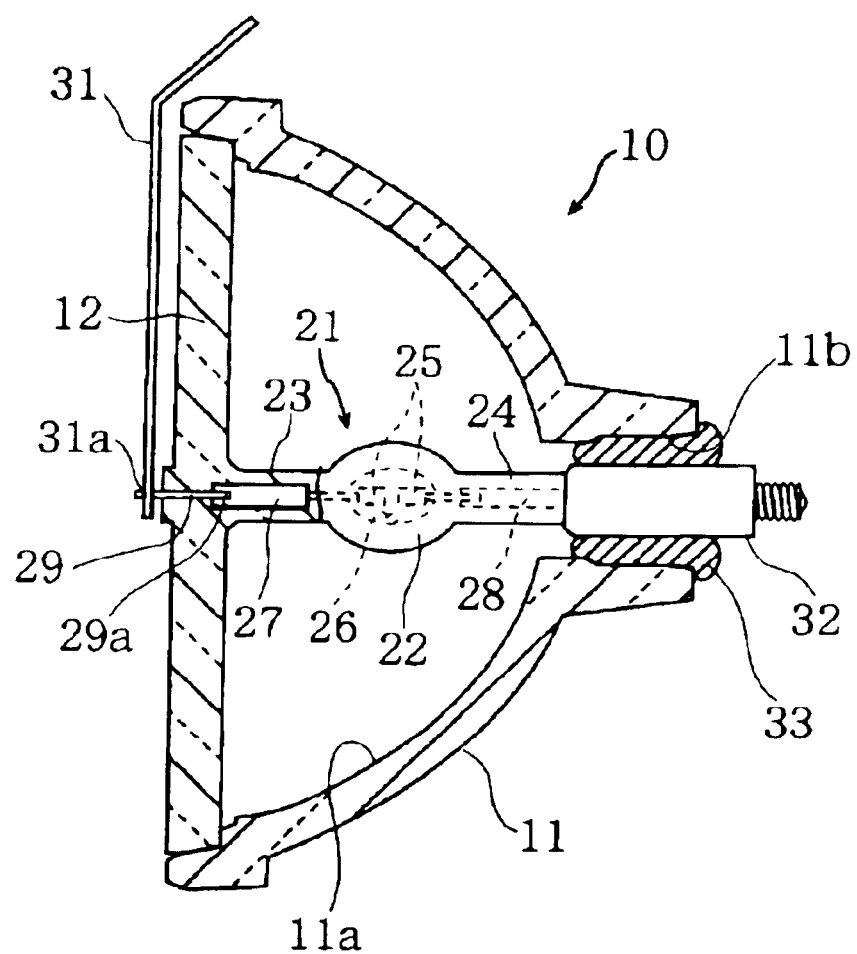
FIG. 9 is a longitudinal sectional view of yet another lamp device of Example 3.
Figure 9:
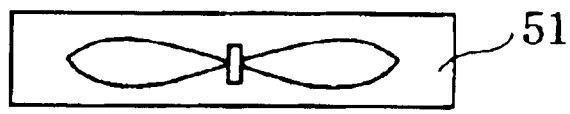

Furthermore, in the example in FIG. 7, the length of the sealed portion 23 is made longer than that of the sealed portion 24 as in Example 1, but there are other possibilities. Namely, when the distance between the light-emitting portion of the discharge lamp 21 and the weld 29a is short, because the temperature near the weld 29a is restricted to a low temperature due to the release of heat from the surface of the glass plate 12, the sealed portion 23 may be made the same length as the sealed portion 24 as shown in FIG. 9 or shorter than the sealed portion 24. For this reason, a lamp device 10, utilizing a discharge lamp 21 having a comparatively large size in comparison to the size of the reflector 11, can be easily constructed.

Moreover, in addition to a construction as described above, in which a discharge lamp is integrally formed with a glass plate, it is also possible to provide a heat releasing device 41 as shown in Example 2.

EXAMPLE 4

An additional example of a lamp device, like that of Example 3, constructed such that a discharge lamp is integrally formed with a glass plate and the front end of a sealed portion contacts outside air is explained.

Figure 10:
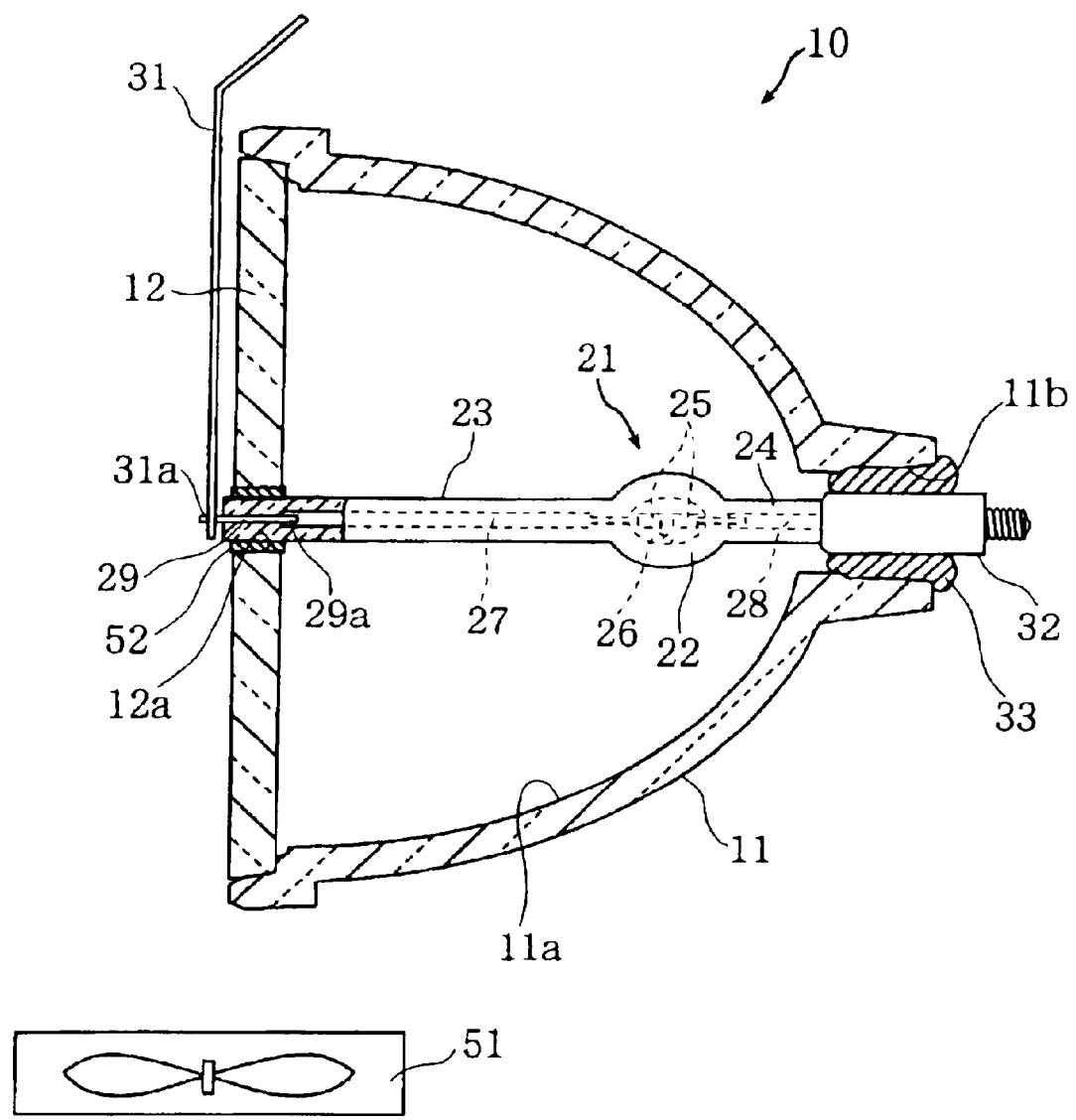
FIG. 10 is a longitudinal sectional view of a lamp device of Example 4.

As shown in FIG. 10, a hole 12a is provided in the central portion of a glass plate 12 such that an end of a sealed portion 23 passes through the hole 12a. The gap between the sealed portion 23 and the hole 12a is bonded and sealed by, for example, a filler 52 composed of substances different than those of the glass plate 12 and the sealed portion 23. It is preferable that the filler, more specifically, be composed of a transparent material such as glass having a lower melting point than the glass plate 12 or the sealed portion 23.

In this way, after separately forming the glass plate 12 and the sealed portion 23, by joining both members, the production process, compared with that of a lamp device of Example 3, utilizing an arc tube 21 integrally formed with a glass plate 12, is simplified.

Even when constructed as described above, as in Example 3, because heat from the front end of the sealed portion 23 is released from the exterior surface of the glass plate 12 and the like, indeed the temperature near the weld 29a of the metal foil 27 and the metal rod 29 is restricted to a low temperature, and disconnection, due to oxidation, corrosion, and the like of the weld 29a and the like, is prevented.

In the present Example also, it is possible to apply the many variations that were explained in Example 3.

It is to be noted that in each of the above-described Examples, examples utilizing an ellipsoidal mirror as the reflector were demonstrated, however the reflector is not limited to an ellipsoidal mirror, and it is also possible to utilize a concave mirror such as a parabolic mirror.

It is also to be noted that, in the above-described Examples, examples, all of which utilized a discharge lamp having an operating pressure of approximately 200 atmospheres, were explained, but the present invention may be applied to a lamp device utilizing a discharge lamp operated at a lower pressure, for example, a pressure of 100 atmospheres or lower.

In addition, the present invention is not limited to lamp devices utilizing discharge lamps having the foil sealed construction as explained in the Examples, but may be suitably applied to lamp devices utilizing all kinds of discharge lamps having welded parts of wiring members near the discharge lamp at which there is a risk of thermal degradation due to high temperatures Furthermore, the gas inside the lamp device is not particularly specified, but it is possible to enclose air or an inert gas such as argon gas.

Moreover, in addition to each of the above-described constructions or in place of each of the above-described constructions, gas inside the lamp device may be circulated between a radiator on the outside such that the inside of the lamp device is cooled.

INDUSTRIAL APPLICABILITY

According to the present invention, because the temperature of the front end of a sealed portion can be restricted to a low temperature and disconnection due to oxidation and the like of the welds of wiring members and the like can be prevented, a lengthening of lamp life and a decline in the percentage of defective lamps can be expected. Furthermore, increase in lamp power and reduction in the size of the reflector can be achieved without difficulty.

In addition, according to the present invention, because an excessive temperature rise inside the lamp device can be prevented even if the lamp device is hermetically sealed, it is possible to limit explosive sounds from the arc tube and to ensure prevention of the scattering of glass fragments and the dispersal of mercury vapor.

What is claimed is:

1. A lamp device comprising:

a discharge lamp comprising an arc tube, the arc tube enclosing luminescent materials and having located therein a pair of opposing electrodes, and first and second sealed portions extending from the arc tube;

a reflector that reflects light radiated by the discharge lamp;

a transparent member covering an open end of the reflector and accommodating the discharge lamp in a space between the transparent member and the reflector; and a heat releasing device for preventing an excessive temperature rise of welded parts of wiring members electrically connected to the electrodes, said heat releasing device comprising:

a heat absorbing part wrapped around substantially the entire length of the first sealed portion; and a plate-like heat channeling part for channeling heat from the heat absorbing part to a location external to the reflector, the heat channeling part passing through the reflector and communicating with an area outside the reflector, wherein a surface of the channeling part is perpendicular to the transparent member.

2. A lamp device according to claim 1, further comprising cooling means for removing conducted heat to a space external to the lamp device.

* * * * *